(12) United States Patent
Ahn et al.

(10) Patent No.: US 11,874,696 B2
(45) Date of Patent: Jan. 16, 2024

(54) DISPLAY DEVICE

(71) Applicant: Samsung Display Co., Ltd., Yongin-si (KR)

(72) Inventors: Seong Sik Ahn, Yongin-si (KR); Ah-Ram Lee, Cheonan-si (KR)

(73) Assignee: Samsung Display Co., Ltd., Yongin-si (KR)

(*) Notice: Subject to any disclaimer, the term of this patent is extended or adjusted under 35 U.S.C. 154(b) by 337 days.

(21) Appl. No.: 17/146,265

(22) Filed: Jan. 11, 2021

(65) Prior Publication Data

US 2021/0318718 A1    Oct. 14, 2021

(30) Foreign Application Priority Data

Apr. 8, 2020 (KR) .......................... 10-2020-0042713

(51) Int. Cl.
| | |
|---|---|
| *G06F 1/16* | (2006.01) |
| *G02B 1/08* | (2006.01) |
| *B32B 37/12* | (2006.01) |
| *B32B 7/12* | (2006.01) |
| *G02F 1/1333* | (2006.01) |
| *H10K 50/80* | (2023.01) |
| *H10K 50/842* | (2023.01) |

(52) U.S. Cl.
CPC .............. *G06F 1/1607* (2013.01); *B32B 7/12* (2013.01); *B32B 37/1284* (2013.01); *G02B 1/08* (2013.01); *G02F 1/133322* (2021.01); *G02F 1/133354* (2021.01); *G06F 1/1637* (2013.01); *H10K 50/80* (2023.02); *B32B 2457/206* (2013.01); *H10K 50/8426* (2023.02)

(58) Field of Classification Search
CPC ....... G06F 1/1607; G06F 1/1637; B32B 7/12; B32B 2457/206; G02B 1/08; G02F 1/133322; G02F 1/133354; H10K 50/8426; H10K 50/80
USPC ................................ 361/679.02; 428/1.5, 1.6
See application file for complete search history.

(56) References Cited

U.S. PATENT DOCUMENTS

| | | | |
|---|---|---|---|
| 9,337,248 B2 | 5/2016 | Youk et al. | |
| 2015/0131023 A1* | 5/2015 | Kim ................ | G02F 1/133308 445/24 |
| 2019/0019450 A1 | 1/2019 | Ahn et al. | |
| 2019/0198586 A1 | 6/2019 | Kim | |
| 2019/0334118 A1 | 10/2019 | Jung et al. | |

FOREIGN PATENT DOCUMENTS

| | | | |
|---|---|---|---|
| CN | 109256479 | 1/2019 | |
| EP | 3608148 A1 * | 2/2020 | ............. B32B 17/06 |
| KR | 10-2016-0038559 | 4/2016 | |
| KR | 10-2019-0004410 | 1/2019 | |
| KR | 10-2019-0007578 | 1/2019 | |
| KR | 10-2019-0077136 | 7/2019 | |

* cited by examiner

*Primary Examiner* — Ruiyun Zhang
(74) *Attorney, Agent, or Firm* — H.C. Park & Associates, PLC

(57) ABSTRACT

A display device, includes: a base substrate including a display region and a peripheral region adjacent to the display region; an indicium on the base substrate; and a support below the base substrate, wherein the support includes: a first part and a second part adjacent to the first part, the first part overlapping the alignment mark and including a transparent material, the second part overlapping the display region; and a first adhesive layer between the base substrate and the second part.

19 Claims, 15 Drawing Sheets

DISPLAY DEVICE

CROSS-REFERENCE TO RELATED APPLICATION

This application claims priority from and the benefit of Korean Patent Application No. 10-2020-0042713 filed on Apr. 8, 2020, which is hereby incorporated by reference for all purposes as if fully set forth herein.

BACKGROUND

Field

Exemplary implementations of the invention relate generally to a display device, more particularly, to a display device including a support layer for a display panel.

Discussion of the Background

There have been developed a variety of display devices used for multimedia apparatuses such as televisions, mobile phones, tablet computers, navigation systems, and game consoles. The display device may include a display module that displays an image and detects external inputs, a polarizing layer on the display panel, and a window. The display module may include a display panel that displays images and an input sensing unit that detects external inputs.

In addition, the display device may include a protective plate disposed below and supporting the display panel and a plurality of lower constituent layers below the protective plate. The display panel may include an alignment mark, and the alignment mark may be used to align the lower constituent layers with the display panel. For example, the protective plate includes a metallic material, and the protective plate overlapping the alignment mark is cut out to allow the alignment mark to be visible through the lower constituent layers.

The above information disclosed in this Background section is only for understanding of the background of the inventive concepts, and, therefore, it may contain information that does not constitute prior art.

SUMMARY

Applicant realized that during manufacture of display devices, cut-out regions of the protective plate may fail to protect the display panel when the lower constituent layers are coupled to the display panel.

Display devices constructed according to the principles and exemplary implementations of the invention provide a support that prevents a display panel from being cracked and through which an indicium such as an alignment mark is visible. For example, a display device may include a support layer that supports a lower portion of a display panel. The first part of the support layer may have a structure that overlaps an alignment mark included in the display panel. As the first part of the support layer includes a transparent material, the alignment mark may be visible even when the support layer overlaps the alignment mark. As a result, when lower constituent layers are coupled below the support layer during manufacture, the first part of the support layer overlapping the alignment mark may prevent the display panel from being damage due to an impact. Moreover, when various inspection processes are performed during the coupling process, the support layer may prevent the display panel from being impacted.

Additional features of the inventive concepts will be set forth in the description which follows, and in part will be apparent from the description, or may be learned by practice of the inventive concepts.

According to one aspect of the invention, a display device, includes: a base substrate including a display region and a peripheral region adjacent to the display region; an indicium on the base substrate; and a support below the base substrate, wherein the support includes: a first part and a second part adjacent to the first part, the first part overlapping the alignment mark and including a transparent material, the second part overlapping the display region; and a first adhesive layer between the base substrate and the second part.

The support may include a support layer having a plate, the first part and the second part may include integral portions of the plate.

The first adhesive layer may have a color and may not overlap the first part.

The first part may be spaced apart from the base substrate.

The support layer may further include a subsidiary adhesive layer between the base substrate and the first part, and the subsidiary adhesive layer may overlap the indicium and may include a transparent material.

The rigidity of the second part may be greater than the rigidity of the first part.

A polarizing layer may be on the base substrate, wherein a lateral surface of the polarizing layer, a lateral surface of the base substrate, and a lateral surface of the plate may be aligned with each other.

The support may further include a resin overlapping the base substrate, the resin at least partially covering a bottom surface of the base substrate and a lateral surface of the support layer.

The resin may have a structure aligned with a lateral surface of the base substrate.

The second part may have substantially the same transparent material as the first part.

The first part and the second part may include different materials, and the support may include a support layer and may further include a subsidiary adhesive layer between the base substrate and the first part, the subsidiary adhesive layer including a transparent material.

The rigidity of the second part may be greater than the rigidity of the first part.

The second part may include a metallic material.

The support layer may further include a resin that may overlap the base substrate, the resin at least partially covering a bottom surface of the base substrate and a lateral surface of the support layer, wherein the resin may have a structure aligned with a lateral surface of the base substrate.

A sub-support may be below the support, wherein the sub-support may include: a sub-plate that may overlap the second part; and a second adhesive layer between the sub-plate and the second part.

The second adhesive layer may have a color, and the sub-plate may include a metallic material.

The first adhesive layer may be further disposed between the base substrate and the first part, the first adhesive layer being transparent.

A protective layer may be below the sub-support layer, the protective layer may overlap the first part and the second part; and a third adhesive layer may be between the first part and the protective layer, wherein each of the protective layer and the third adhesive layer may be transparent.

The indicium may include one or alignment marks overlapping the peripheral region.

According to another aspect of the invention, a display device includes at least one alignment mark; and a support layer disposed below and supporting the display panel, wherein the support layer includes: a plate having a first part and a second part adjacent to the first part, the first part overlapping the alignment mark and including a transparent material; and an adhesive layer between the display panel and the second part, the adhesive layer not overlapping the first part.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
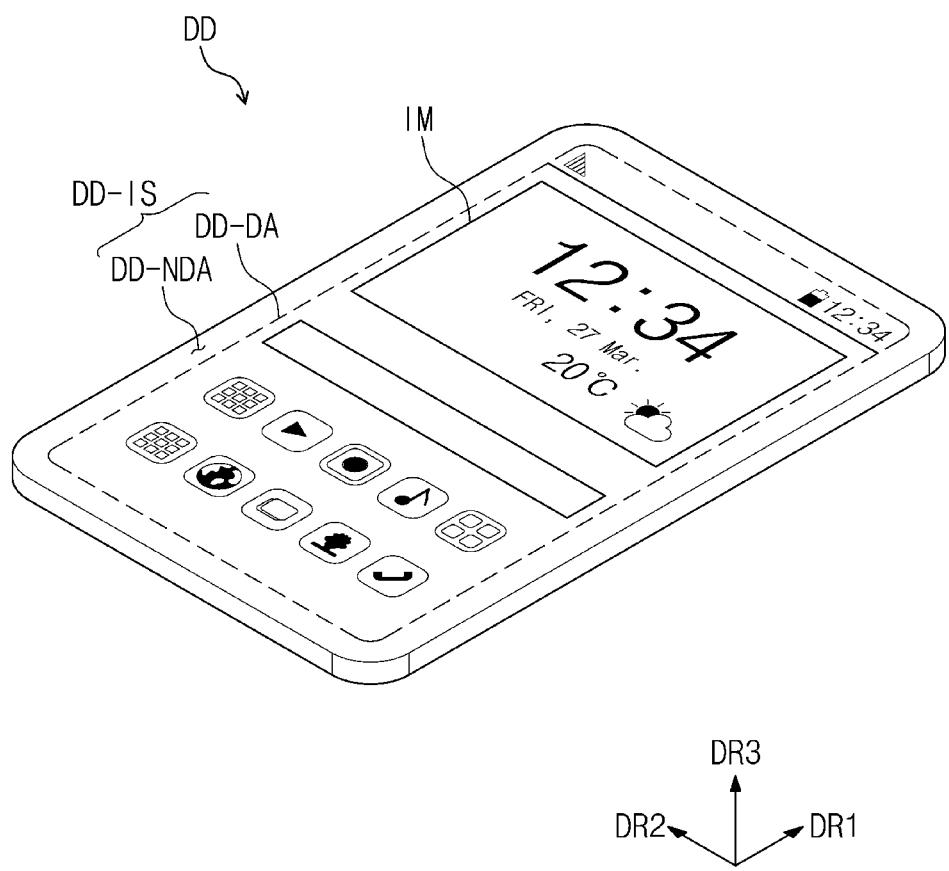
FIG. 1A is a perspective view illustrating an exemplary embodiment of a display device constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "has," "having," "includes," and/or "including," when used in this specification, specify the presence of stated features, integers, steps, operations, elements, components, and/or groups thereof, but do not preclude the presence or addition of one or more other features, integers, steps, operations, elements, combinations, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

As used herein, the term "integral" means two or more parts or elements forming or functioning as a single unit or object.

Figure 1B:
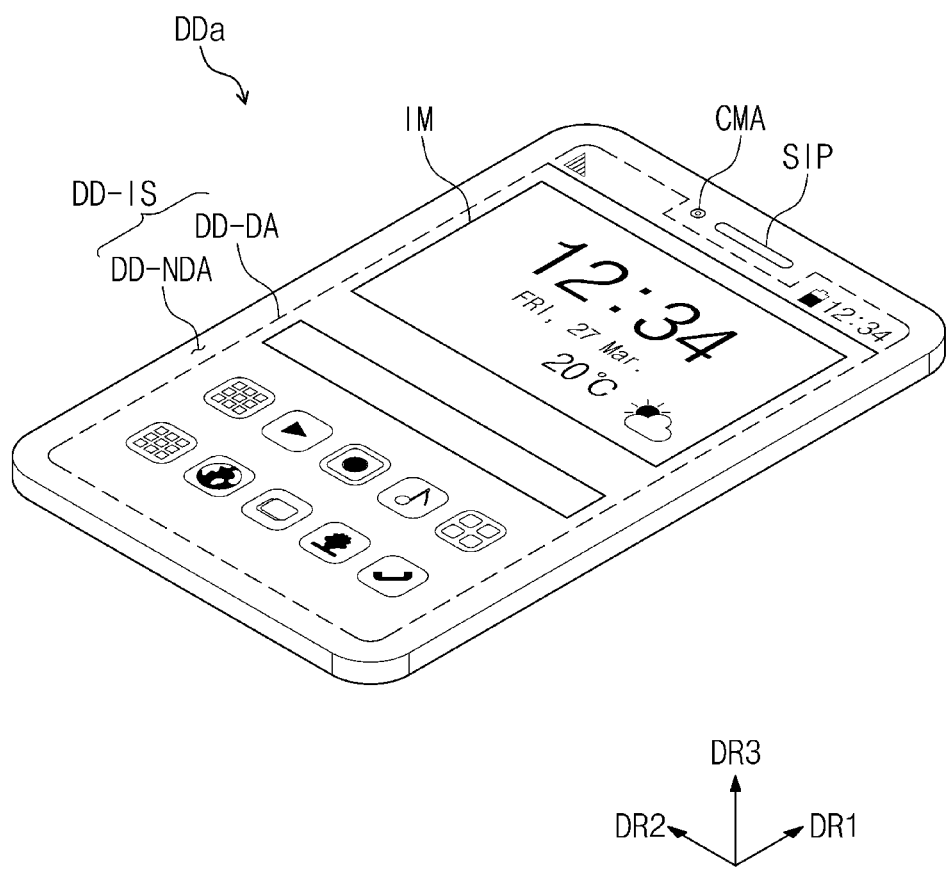
FIG. 1B is a perspective view illustrating another exemplary embodiment of a display device constructed according to principles of the invention.

FIG. 1A is a perspective view illustrating an exemplary embodiment of a display device constructed according to principles of the invention. FIG. 1B is a perspective view illustrating another exemplary embodiment of a display device constructed according to principles of the invention.

Referring to FIG. 1A, a display device DD may display an image IM on a display surface DD-IS. A clock window and application icons are illustrated as examples of the image IM. The display surface DD-IS includes a display region DD-DA on which the image IM is displayed and a peripheral region DD-NDA adjacent to the display region DD-DA. The peripheral region DD-NDA is a zone on which no image is displayed.

For example, the peripheral region DD-NDA may surround the display region DD-DA. For another example, the peripheral region DD-NDA may be disposed adjacent to only one side of the display region DD-DA or no peripheral region may be provided in some exemplary embodiments.

The display surface DD-IS may have a shape elongated in a first direction DR1 and in a second direction DR2 that intersects the first direction DR1. A third direction DR3 indicates a normal direction to the display surface DD-IS, or the thickness direction of the display device DD. As used herein, the phrase "when viewed in plan" or "when viewed on a plane" may mean "when viewed in the third direction DR3." The third direction DR3 differentiates front and rear surfaces (or top and bottom surfaces) of each layer or unit which will be discussed below. However, directions indicated by the first, second, and third directions DR1, DR2, and DR3 are relative concepts and may denote respective opposite directions.

According to some exemplary embodiments, at least a portion of the display surface DD-IS may have a generally curved shape when viewed in a plan view. For example, at least one corner of the display surface DD-IS may have a generally curved shape when viewed in a plan view. Although at least one of the display surface DD-IS is exemplarily illustrated to have a generally curved shape, at least one of outer edges of the display surface DD-IS may have a generally curved shape.

When viewed in a plan view, a portion of the display device DD may include a generally cubic display surface. The generally cubic display surface may include a plurality of display regions oriented in different directions or have a generally polygonal pillar-shape display surface.

In some exemplary embodiments, as shown in FIG. 1A, the display device DD may be used for a mobile phone terminal. The mobile phone terminal may be configured to include the display device DD in a bracket/casing which accommodates a mainboard on which are installed electronic modules, a camera module, a power module, and the like. The display device DD according to some exemplary embodiments may be applicable not only to large-sized electronic devices such as television sets and monitors, but to small and middle-sized electronic devices such as tablet computers, automotive navigation systems, game consoles, and smart watches.

Referring to FIG. 1B, a display device DDa may include an atypically shaped display region DD-DA. For example, in comparison with the display region DD-DA of FIG. 1A, the display region DD-DA of FIG. 1B may further include a display section whose shape has at least one side that protrudes in the first direction DR1. The display device DDa may include a speaker SIP and a camera module CMA that are disposed adjacent to the protruding shaped display section.

The speaker SIP and the camera module CMA are disposed to overlap a peripheral region DD-NDA and not to overlap the display region DD-DA. The display device DD of FIG. 1A may also include the speaker SIP and the camera module CMA that are disposed to overlap the peripheral region DD-NDA. In some exemplary embodiments, the camera module CMA may be provided to have a structure that overlaps the display region DD-DA.

FIGS. 1A and 1B show that rigid display devices DD and DDa, but according to some exemplary embodiments, at least one of the display devices DD and DDa may have a flexible property. For example, at least one of the display devices DD and DDa may be foldable about a folding axis or have a generally curved shape on at least a portion thereof.

Figure 2:
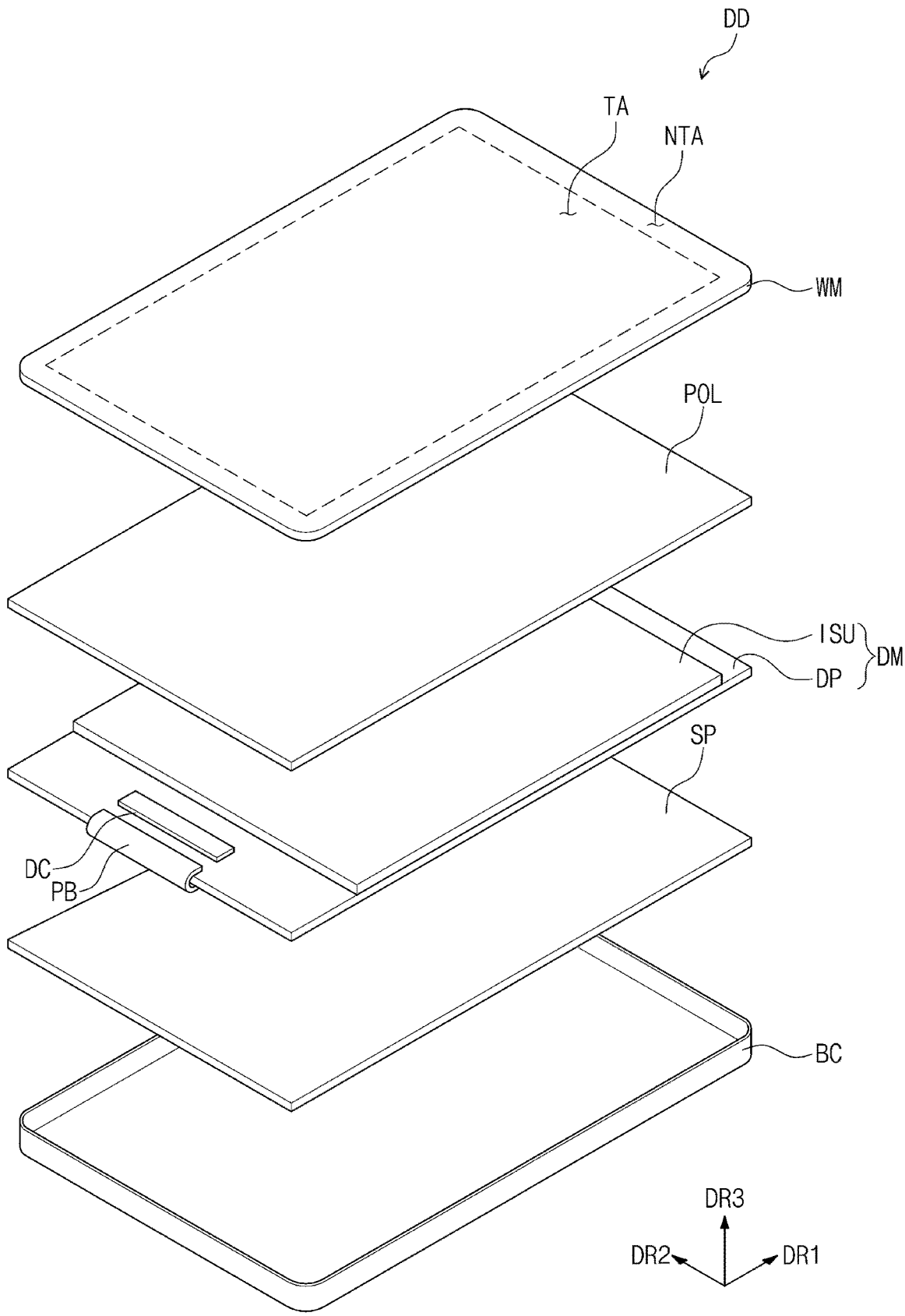
FIG. 2 is an exploded, perspective view illustrating the display device of FIG. 1A.
Figure 3:
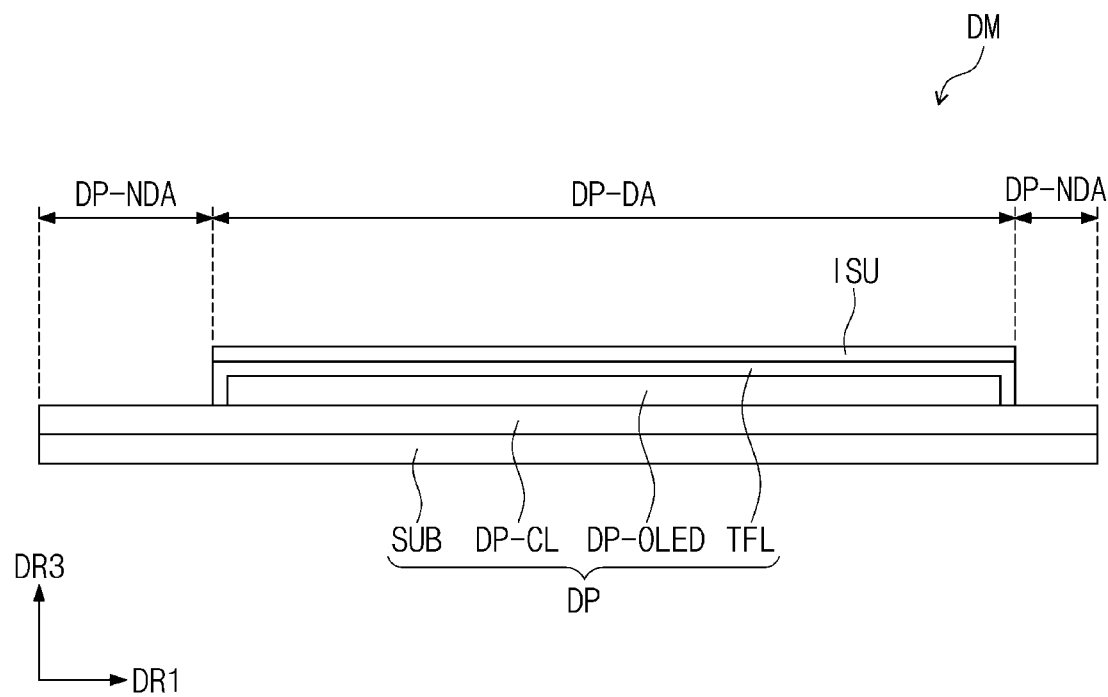
FIG. 3 is a cross-sectional view illustrating an exemplary embodiment of a display module constructed according to principles of the invention.

FIG. 2 is an exploded, perspective view illustrating the display device of FIG. 1A. FIG. 3 is a cross-sectional view illustrating an exemplary embodiment of a display module constructed according to principles of the invention.

Referring to FIG. 2, the display device DD may include a window WM, a display module DM, a driver chip DC, a circuit board PB, a support layer SP, and an accommodation member BC. The accommodation member BC may receive the display module DM and may be coupled to the window WM.

The window WM may be disposed above the display module DM and may externally transmit an image provided from the display module DM. The window WM includes a transmission region TA and a non-transmission region NTA. The transmission region TA may overlap the display region DD-DA and may have a shape substantially corresponding to that of the display region DD-DA. The image IM displayed on the display region DD-DA of the display device DD shown in FIG. 1A may be externally visible through the transmission region TA of the window WM.

The non-transmission region NTA may overlap the peripheral region DD-NDA and may have a shape substantially corresponding to that of the peripheral region DD-NDA. The non-transmission region NTA may be a zone whose optical transmittance is relatively less than that of the transmission region TA. Some exemplary embodiments, however, are not limited thereto, and the non-transmission region NTA may be omitted.

The window WM may be formed of a glass, a sapphire, or a plastic. Although the window WM is illustrated as a single layer, the window WM may include a plurality of layers. The window WM may include a base layer and at least one printed layer that overlaps the non-transmission region NTA and is disposed on a rear surface of the base layer. The printed layer may have a certain color. For example, the printed layer may have either a black color or any color other than the black color.

The display module DM is disposed between the window WM and the accommodation member BC. The display module DM includes a display panel DP and an input sensing layer ISU. The display panel DP may generate an image and may transfer the generated image to the window WM.

According to some exemplary embodiments, the display panel DP may be an emissive display panel and is not particularly limited in its type. For example, the display panel DP may be an organic light emitting display panel or a quantum-dot light emitting display panel. An emission layer of an organic light emitting display panel may include an organic light emitting material. An emission layer of the quantum-dot light emitting display panel may include a quantum-dot or a quantum-rod. The following will discuss an example in which an organic light emitting display panel is adopted as the display panel DP.

The following will describe an example in which an organic light emitting display panel is adopted as the display panel DP according to some exemplary embodiments. Some exemplary embodiments, however, are not limited thereto, and in some exemplary embodiments, various types of display panels are applicable.

The input sensing layer ISU may be disposed between the window WM and the display panel DP. The input sensing layer ISU detects an externally applied input. The externally applied input may be provided in various types. For example, the external input includes a user's body part, a stylus pen, light, heat, pressure, or any various types of external input. In addition, the external input may not only include a user's touch such as user's hands, but may also include an approaching or proximal spatial touch (e.g., hovering touch).

Referring to FIG. 3, the display panel DP includes a base substrate SUB, a circuit element layer DP-CL, a display element layer DP-OLED, and a dielectric layer TFL. The display panel DP includes a display region DP-DA and a peripheral region DP-NDA. The display region DP-DA of the display panel DP corresponds either to the display region DD-DA shown in FIG. 1A or to the transmission region TA shown in FIG. 1B, and the peripheral region DP-NDA of the display panel DP corresponds either to the peripheral region DD-NDA shown in FIG. 1A or to the non-transmission region NTA shown in FIG. 1B.

The base substrate SUB may include at least one plastic film. The base substrate SUB may include a flexible substrate, for example, at least one selected from a plastic substrate, a glass substrate, a metal substrate, and an organic/inorganic composite substrate. The circuit element layer DP-CL includes at least one intermediate dielectric layer and a circuit element. The intermediate dielectric layer includes at least one intermediate inorganic layer and at least one intermediate organic layer. The circuit element includes signal lines and a pixel driver circuit.

The display element layer DP-OLED includes a plurality of organic light emitting diodes. The display element layer DP-OLED may further include an organic layer such as a pixel definition layer. According to some exemplary embodiments, when the display panel DP is provided in the type of a liquid crystal display panel, the display element layer DP-OLED may be provided in the type of a liquid crystal layer.

The dielectric layer TFL encapsulates the display element layer DP-OLED. For example, the dielectric layer TFL may be a thin-film encapsulation layer. The dielectric layer TFL protects the display element layer DP-OLED against foreign substances such as moisture, oxygen, and dust particles. Some exemplary embodiments, however, are not limited thereto, and the dielectric layer TFL may be replaced with an encapsulation substrate. In this case, the encapsulation substrate may stand opposite to the base substrate SUB, and the circuit element layer DP-CL and the display element layer DP-OLED may be disposed between the encapsulation substrate and the base substrate SUB.

The input sensing layer ISU may be directly disposed on the display panel DP. As used herein, the phrase "A is directly disposed on B" means that no adhesive layer is disposed between A and B. In some exemplary embodiments, the input sensing layer ISU and the display panel DP may be fabricated in a successive process. Some exemplary embodiments, however, are not limited thereto. The input sensing layer ISU may be provided in the form of an individual panel, and may be coupled through an adhesive layer to the display panel DP.

Referring back to FIG. 2, the driver chip DC may be disposed on the display panel DP, while overlapping the peripheral region DP-NDA. For example, in response to control signals transferred from the circuit board PB, the driver chip DC may generate driving signals required for operation of the display panel DP. The driver chip DC may transfer the generated driving signals to the circuit element layer DP-CL of the display panel DP.

The circuit board PB may be disposed at an end of the base substrate SUB and may be electrically connected to the circuit element layer DP-CL. The circuit board PB may be rigid or flexible. For example, when the circuit board PB is flexible, the circuit board PB may be provided as a flexible printed circuit board. The circuit board PB may include a timing control circuit that controls operation of the display panel DP. The timing control circuit may be provided in the form of an integrated circuit chip mounted on the circuit board PB. In addition, the circuit board PB may include an input sensing circuit that controls the input sensing layer ISU.

A polarizing layer POL is disposed between the display module DM and the window WM. The polarizing layer POL may polarize external light that is incident through the window WM, and thus circuit elements included in the display module DM may be prevented from being externally visible. The display device DD may further include an adhesive layer between the polarizing layer POL and the input sensing layer ISU and an adhesive layer between the polarizing layer POL and the window WM.

In some exemplary embodiments, the polarizing layer POL may be omitted. In this case, the polarizing layer POL may be replaced with a color filter layer between the window WM and the display module DM. The color filter layer may absorb external light that is incident from outside, and thus circuit elements may be prevented from being visible. The color filter layer may include filters having different colors from each other.

The support layer SP may be disposed between the display module DM and the accommodation member BC. The support layer SP may be placed below the base substrate SUB illustrated in FIG. 3, thereby supporting almost the entirety of the display panel DP. The support layer SP may include a base layer that supports the display panel DP. In addition, the support layer SP may prevent external light from being incident on the base substrate SUB. The support layer SP may include a light-absorbing layer that absorbs external light. The light-absorbing layer may have a color, for example, black. The base layer may support the light-absorbing layer. The support layer SP will be further discussed in detail below.

Figure 4:
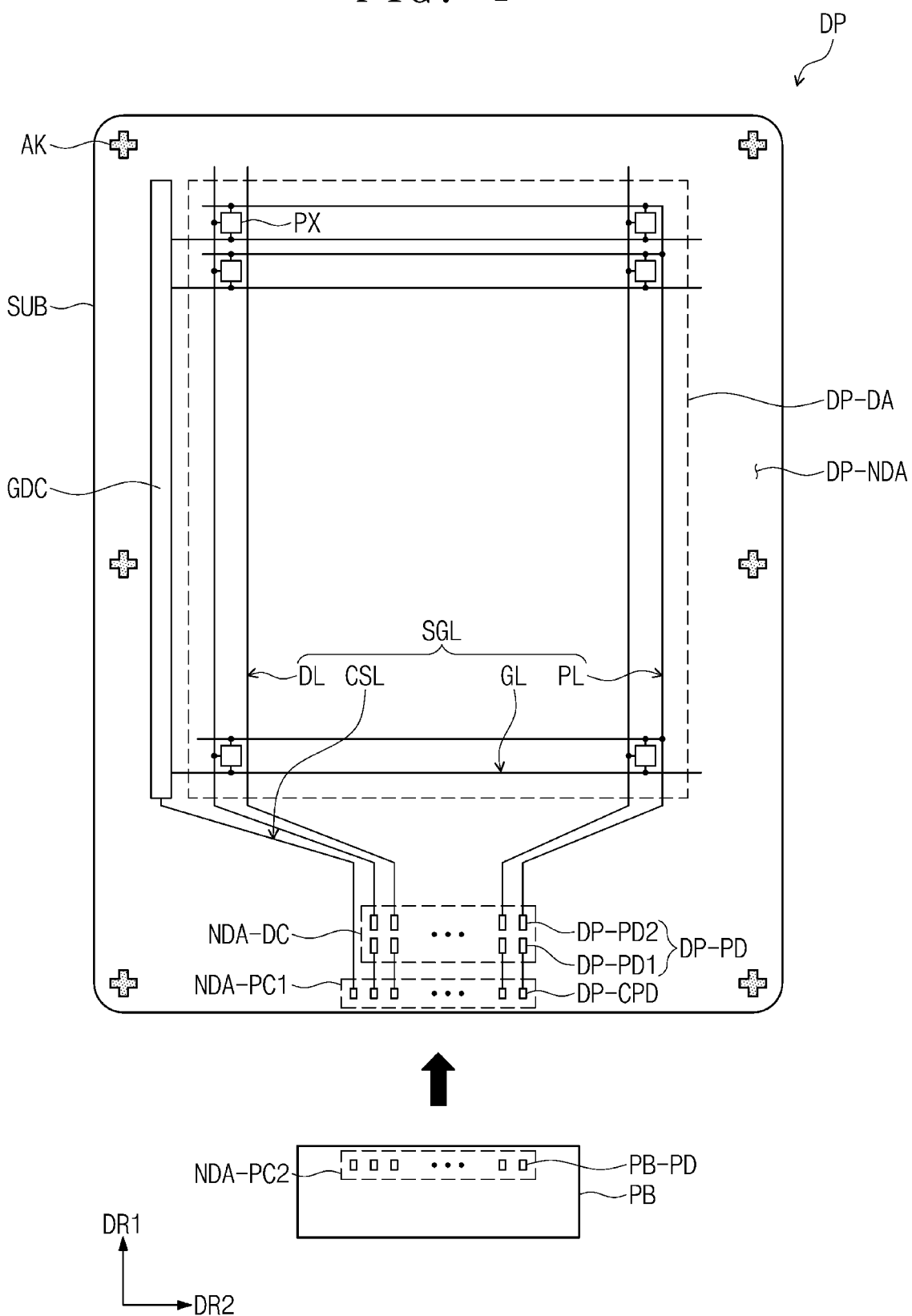
FIG. 4 is a plan view illustrating an exemplary embodiment of a display panel constructed according to principles of the invention.

FIG. 4 is a plan view illustrating an exemplary embodiment of a display panel constructed according to principles of the invention.

Referring to FIG. 4, the display panel DP may include a driver circuit GDC, a plurality of signal lines SGL, a plurality of signal pads DP-PD, a plurality of connection signal pads DP-CPD, and a plurality of pixels PX. The representative pixels PX are disposed on the display region DP-DA. Each of the pixels PX includes an organic light emitting diode and a pixel driver circuit connected to the organic light emitting diode. The driver circuit GDC, the signal lines SGL, the signal pads DP-PD, the connection signal pads DP-CPD, and the pixel driver circuit may be included in the circuit element layer DP-CL shown in FIG. 3.

The signal lines SGL include gate lines GL, data lines DL, a power line PL, and a control signal line CSL. The gate lines GL are connected to corresponding pixels PX, and the data lines DL are connected to corresponding pixels PX. The power line PL is connected to the pixels PX. The control signal line CSL may provide a scan driver circuit with control signals.

The driver circuit GDC sequentially outputs gate signals to a plurality of gate lines GL. The driver circuit GDC may further output different control signals to the pixels PX. The driver circuit GDC may include a plurality of thin-film transistors formed by, for example, one of a low temperature polycrystalline silicon (LTPS) process and a low temperature polycrystalline oxide (LTPO) process each of which is the same as that used to form a driver circuit for the pixels PX.

The signal lines SGL may overlap the display region DP-DA and the peripheral region DP-NDA. Each of the signal lines SGL may include a pad part and a line part that may be formed integrally together, i.e., constitute a single unitary shape. The line part overlaps the display region DP-DA and the peripheral region DP-NDA. The pad part is connected to a distal end of the line part. The pad part is disposed on the peripheral region DP-NDA and overlaps a corresponding one of the signal pads DP-PD.

The peripheral region DP-NDA may have a chip region NDA-DC defined at its section on which the signal pads DP-PD are disposed, and also have a first pad region NDA-PC1 defined at its section on which the connection signal pads DP-CPD are disposed.

The driver chip DC shown in FIG. 2 may be mounted on the chip region NDA-DC. The signal pads DP-PD are electrically connected to the driver chip DC and provide the signal lines SGL with electrical signals received from the driver chip DC.

The signal pads DP-PD include first-row signal pads DP-PD1 that are arranged in a first row along the first direction DR1 and second-row signal pads DP-PD2 that are arranged in a second row along the first direction DR1. The exemplary embodiments, however, are not limited thereto, and the signal pads DP-PD may be arranged in a single row along the first direction DR1.

A portion of the circuit board PB may be disposed on the first pad region NDA-PC1. The connection signal pads DP-CPD are electrically connected to the circuit board PB and provide the signal pads DP-PD with electrical signals received from the circuit board PB. The circuit board PB may be rigid or flexible. For example, when the circuit board PB is flexible, the circuit board PB may be provided as a flexible printed circuit board.

The circuit board PB may include a timing control circuit that controls operation of the display panel DP. The timing control circuit may be provided in the form of an integrated circuit chip mounted on the circuit board PB. In addition, the circuit board PB may include an input sensing circuit that controls the input sensing layer ISU. The circuit board PB may include driving pads PB-PD electrically connected to the display panel DP. The driving pads PB-PD may be disposed on a second pad region NDA-PC2 defined on the circuit board PB.

According to some exemplary embodiments, the display panel DP may include at least one indicium that may be in the form of an alignment mark AK. Although FIG. 4 shows six alignment marks AK that overlap an edge of the base substrate SUB, the number of the alignment marks AK is not limited thereto and any suitable number may be included.

The display device DD may further include a plurality of lower constituent layers between the support layer SP and the accommodation member BC. For example, the lower constituent layers may include a thermal radiation layer, a cushion layer, and a metal layer. The alignment mark AK may be an indication mark for exact alignment of the lower constituent layers with the display panel DP. For example, the alignment mark AK may allow the lower constituent layers to occupy desired locations below the display panel DP.

According to some exemplary embodiments, the alignment mark AK may be disposed on the base substrate SUB, while overlapping the peripheral region DP-NDA. FIG. 4 exemplarily shows that the alignment mark AK is positioned in the vicinity of an edge of the base substrate SUB, but the base substrate SUB may be provided with the alignment mark AK on any other section that overlaps the peripheral region DP-NDA. As used herein, the alignment mark AK is illustrated to overlap the peripheral region DP-NDA on the base substrate SUB, but at least one of a plurality of alignment marks AK may overlap the display region DP-DA.

Figure 5A:
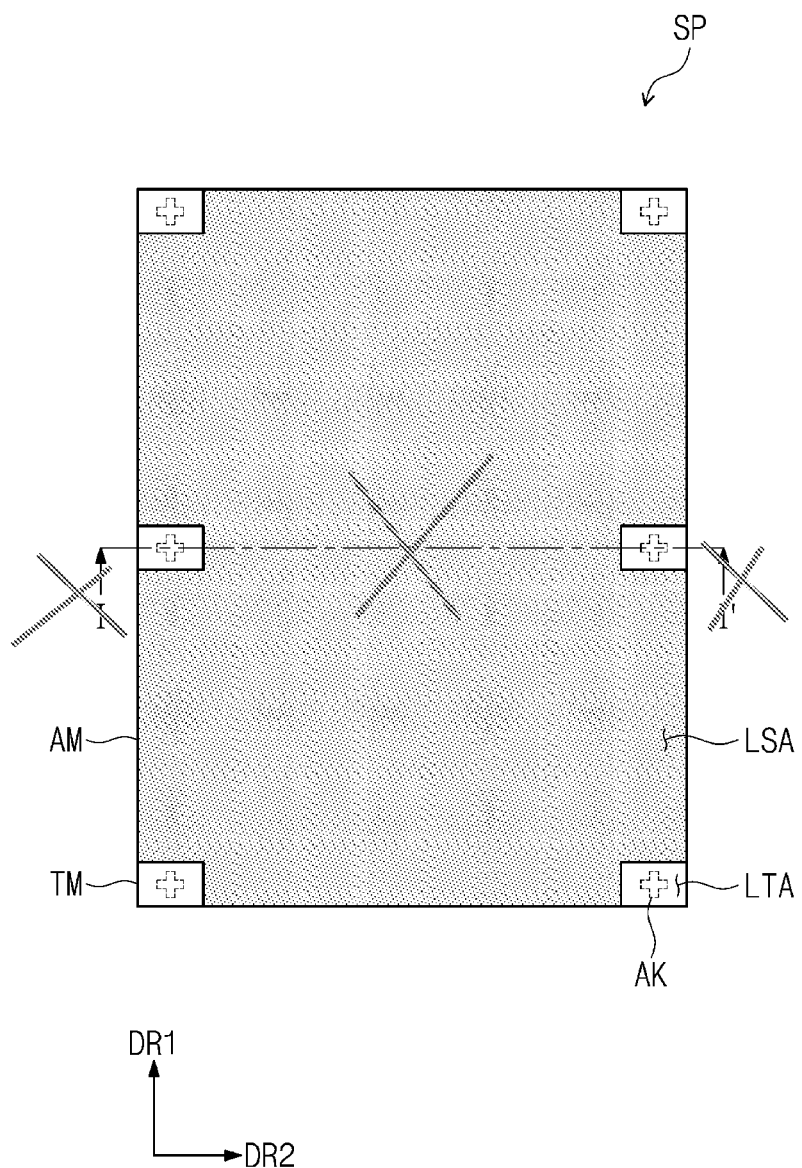
FIG. 5A is a plan view illustrating an exemplary embodiment of a support layer constructed according to principles of the invention.
Figure 5B:
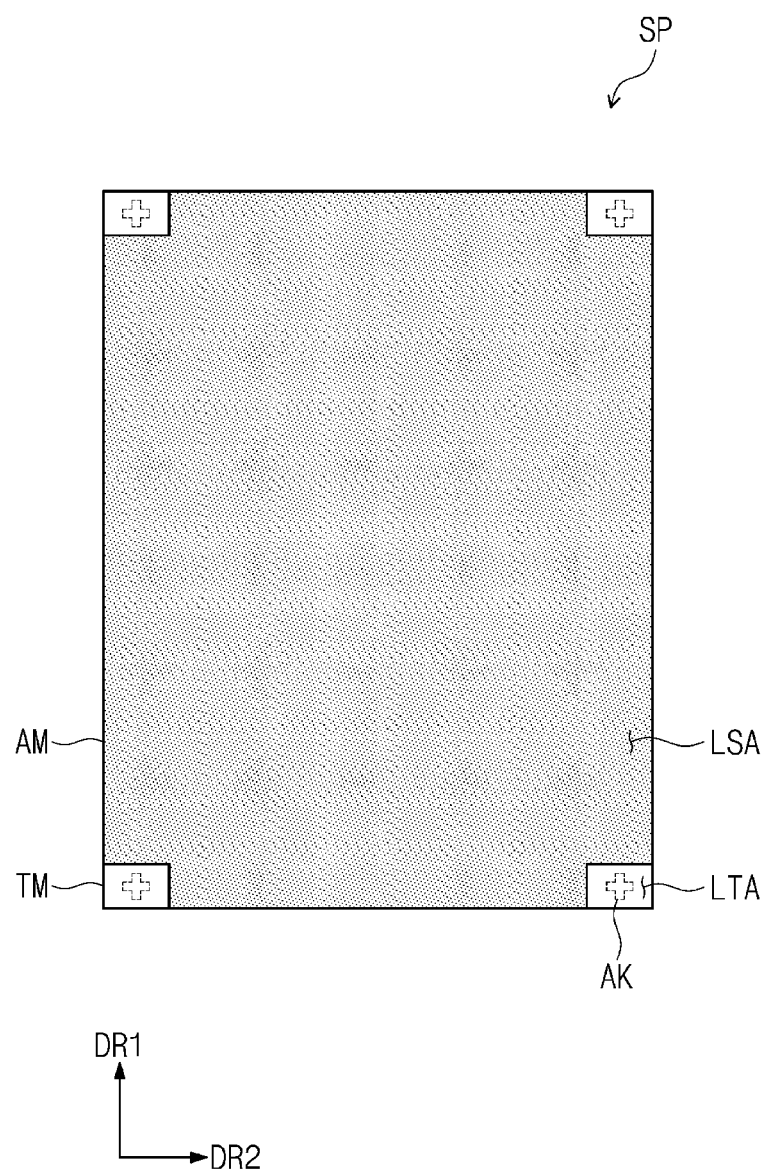
FIG. 5B is a plan view illustrating another exemplary embodiment of a support layer constructed according to principles of the invention.
Figure 5C:
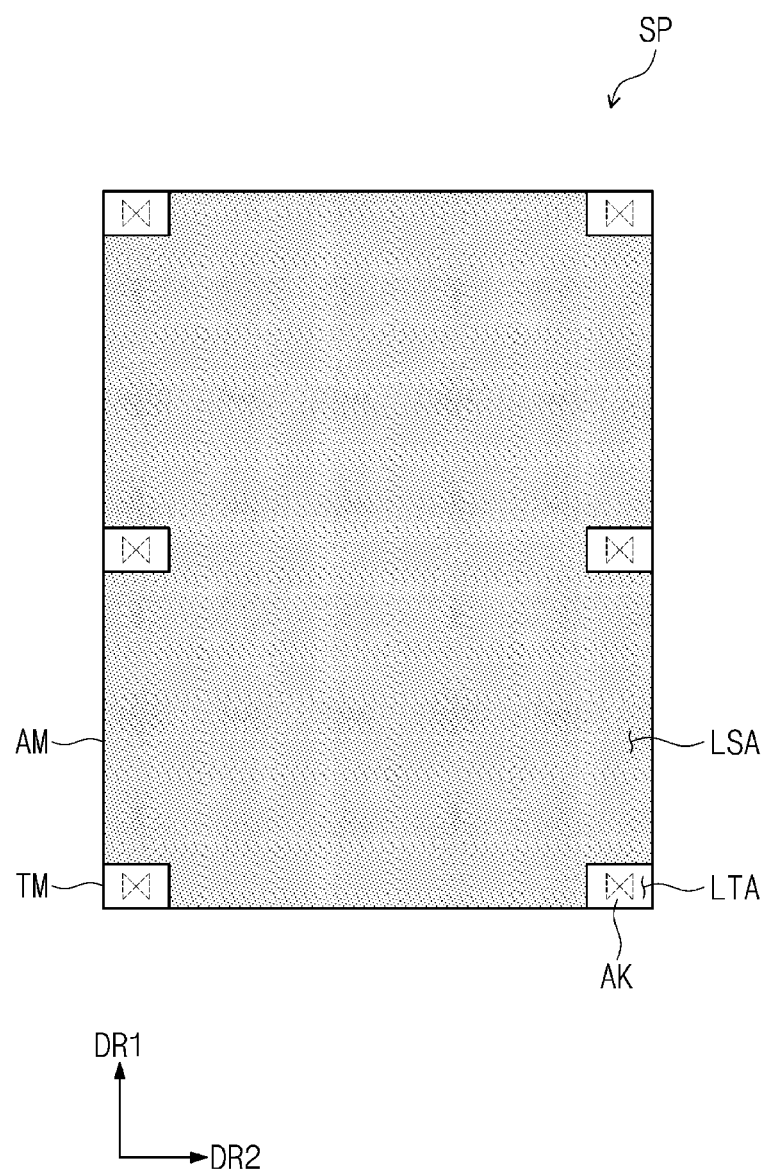
FIG. 5C is a plan view illustrating a further exemplary embodiment of a support layer constructed according to principles of the invention.
Figure 6:
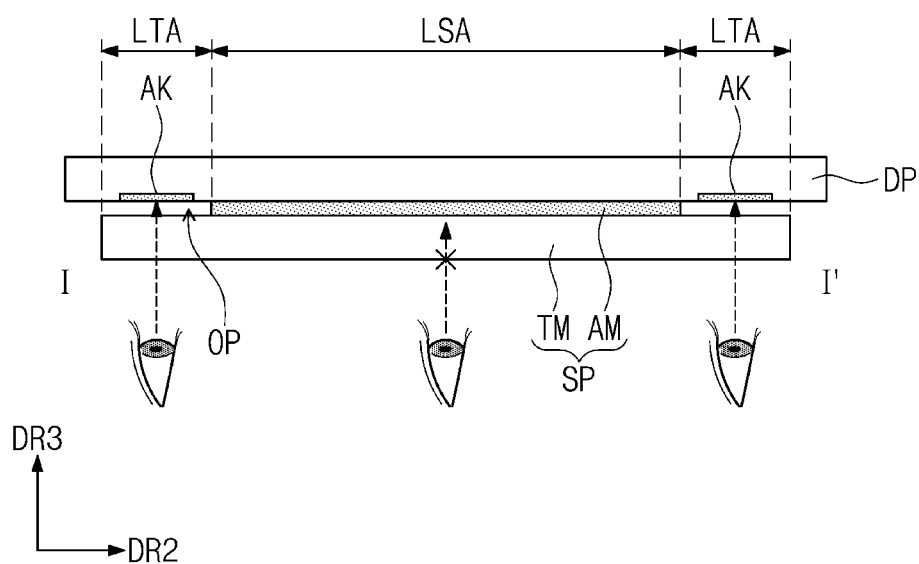
FIG. 6 is a partial, cross-sectional view of an exemplary embodiment of the, display device of FIG. 1A.

FIG. 5A is a plan view illustrating an exemplary embodiment of a support layer constructed according to principles of the invention. FIG. 5B is a plan view illustrating another exemplary embodiment of a support layer constructed according to principles of the invention. FIG. 5C is a plan view illustrating a further exemplary embodiment of a support layer constructed according to principles of the invention. FIG. 6 is a partial, cross-sectional view of an exemplary embodiment of the, display device of FIG. 1A.

Referring to FIG. 5A, the support layer SP may include a first region LTA and a second region LSA. As used herein, the first region LTA of the support layer SP indicates a zone through which light may pass, and the second region LSA of the support layer SP denotes a zone through which light may not pass.

The support layer SP may be disposed below the base substrate SUB as shown in FIG. 4, and the alignment mark AK may be visible through the first region LTA. For example, the alignment mark AK may be visible through a rear surface of the support layers SP that overlaps the first region LTA. To achieve recognition of the alignment mark AK, the base substrate SUB may include a transparent material, and components between the base substrate SUB and the alignment mark AK may also include a transparent material. For example, at least one transparent dielectric layer may be disposed between the base substrate SUB and the alignment mark AK.

Referring to FIG. 5B, the alignment mark AK may have a structure that overlaps a corner portion of the support layer SP. For example, the support layer SP shown in FIG. 5A may have a structure that overlaps six alignment marks AK, and the support layer SP shown in FIG. 5B may have a structure that overlaps four alignment marks AK at corner portions of the support layer SP.

Referring to FIG. 5C, the alignment mark AK according to some exemplary embodiments may have various shapes when viewed in plan. The alignment mark AK shown in FIG. 5C may have a different shape from that of the alignment mark AK illustrated in FIG. 5A or 5B. For example, according to that shown in FIG. 5C, the alignment mark AK is illustrated to appear as a shape of bilaterally symmetric triangles. In some exemplary embodiments, referring to FIGS. 5A and 6, the support layer SP includes a plate TM and an adhesive layer AM.

The plate TM may support the display panel DP, while overlapping the first region LTA and the second region LSA. The plate TM may have a first part that corresponds to the first region LTA and a second part that corresponds to the second region LSA. The second part, which corresponds to the second region LSA, of the plate TM may support almost the entirety of the display panel DP that overlaps the display region DP-DA shown in FIG. 4. In addition, the second part, which corresponds to the second region LSA, of the plate TM may support at least a portion of the display panel DP that overlaps the peripheral region DP-NDA shown in FIG. 4.

According to some exemplary embodiments, the plate TM may include a transparent material. For example, the plate TM may include a polyethylene terephthalate (PET) or a polyethylene naphthalate (PEN). As the plate TM is provided as a transparent material, the alignment mark AK included in the display panel DP may be visible through the first part of the plate TM, which first part overlaps the first region LTA. Therefore, the lower constituent layers below the support layer SP may be aligned with the display panel DP through the first part of the plate TM.

According to an embodiment shown in FIG. 6, the first and second parts of the plate TM may be provided in the form of a single layer. When a plate is provided as a rigid metallic material, the plate has a structure that does not overlap the alignment mark AK in order to recognize the alignment mark AK. For example, the plate may be cut out at its portion (e.g., an edge) that overlaps the alignment mark AK. In this case, the edge (e.g., the cut-out portion) of the plate may provide a display panel with impact during a procedure where the lower constituent layers are coupled to the support layer SP. For this reason, the display panel may be partially damaged.

According to some exemplary embodiments, the first part, which corresponds to the first region LTA, of the plate TM may have a structure that overlaps the alignment mark AK included in the display panel DP. For example, as discussed above, the plate TM may have a structure to allow the alignment mark AK to be externally visible even when the plate TM overlaps the alignment mark AK. As a result, during a process where the lower constituent layers are coupled below the support layer SP, the first part of the plate TM may prevent impact on the display panel DP that corresponds to the first region LTA. Moreover, as the plate TM includes a material such as a polyethylene terephthalate (PET) whose rigidity is less than that of a metallic material, the display panel DP may be less damaged.

The adhesive layer AM may be disposed between the display panel DP and the second part of the plate TM. The adhesive layer AM may overlap the second region LSA and may attach the display panel DP and the plate TM to each other. For example, the adhesive layer AM may be a pressure sensitive adhesive film (PSA). As the adhesive layer AM has a structure that overlaps the second region LSA, an interval space OP may be defined between the display panel DP and the first part of the plate TM.

The adhesive layer AM may have a color to adsorb external light. In some exemplary embodiments, the adhesive layer AM may have a black color to absorb light having a wide wavelength range. As the adhesive layer AM overlapping the second region LSA has a black color, the adhesive layer AM may inhibit the display panel DP from receiving light that is incident through the plate TM. Consequently, a circuit of the display panel DP may be prevented from being externally visible.

Figure 7:
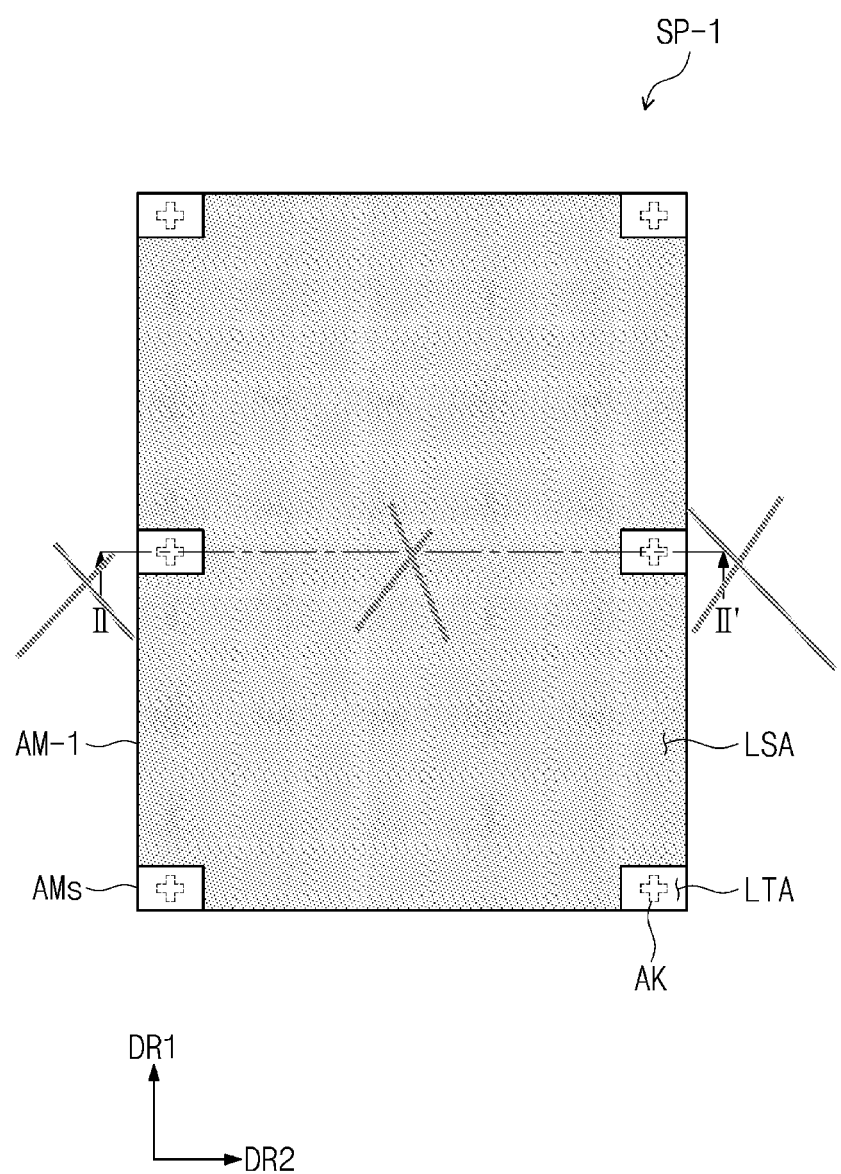
FIG. 7 is a plan view illustrating yet another support layer of FIG. 1A constructed according to principles of the invention.
Figure 8A:
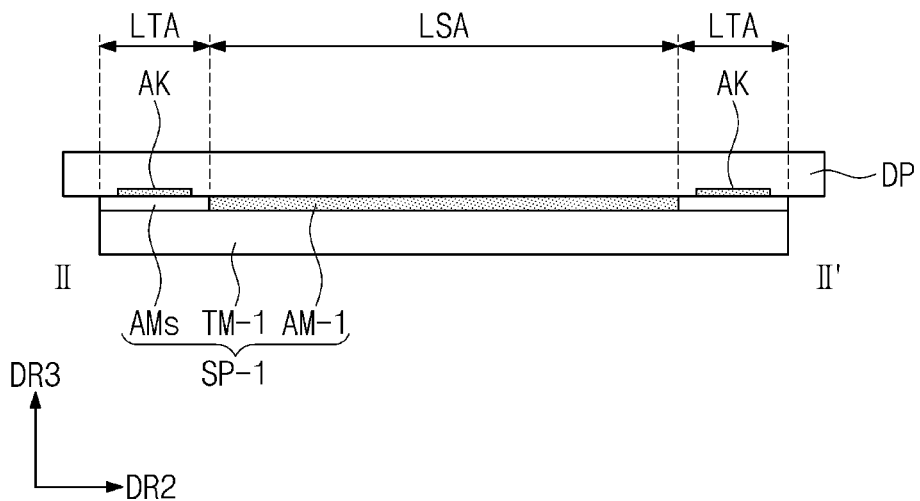
FIG. 8A is a partial cross-sectional view of another exemplary embodiment of the display device of FIG. 1A.
Figure 8B:
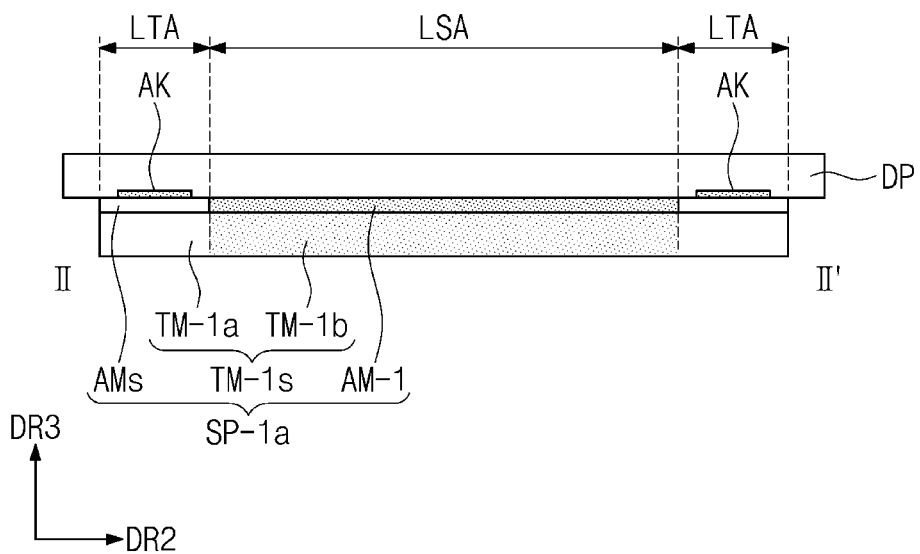
FIG. 8B is a partial, cross-sectional view of a further exemplary embodiment of the display device of FIG. 1A.

FIG. 7 is a plan view illustrating yet another support layer of FIG. 1A constructed according to principles of the invention. FIG. 8A is a partial cross-sectional view of another exemplary embodiment of the display device of FIG. 1A. FIG. 8B is a partial, cross-sectional view of a further exemplary embodiment of the display device of FIG. 1A.

A support layer SP-1 shown in FIG. 7 may have substantially the same structure as that of the support layer SP shown in FIG. 5A, except that a subsidiary adhesive layer AMs is included in the support layer SP-1. The following will thus describe in detail a configuration of the subsidiary adhesive layer AMs with reference to FIGS. 7 and 8A.

Referring to FIG. 8A, an adhesive layer AM-1 overlapping the second region LSA may include a different material from that of the subsidiary adhesive layer AMs overlapping the first region LTA. For example, the adhesive layer AM-1 overlapping the second region LSA may be an adhesive film that has a color to absorb light, and the subsidiary adhesive layer AMs overlapping the first region LTA may be an adhesive film to allow light to pass therethrough. A plate TM-1 may be provided in the form of a single unitary body.

For example, the adhesive layer AM-1 may be disposed between the plate TM-1 and the display panel DP that overlap the second region LSA. The subsidiary adhesive layer AMs may be disposed between the plate TM-1 and the display panel DP that overlap the first region LTA. The subsidiary adhesive layer AMs may include a transparent material. As a result, the alignment mark AK of the display panel DP may be visible through a lower portion of the plate TM-1 that overlaps the first region LTA. For example, the subsidiary adhesive layer AMs may be an optically clear adhesive (OCA) film, an optically clear resin (OCR), or a pressure sensitive adhesive (PSA) film.

In comparison with the plate TM-1 shown in FIG. 8A, a plate TM-1s shown in FIG. 8B may include parts having different rigidities from each other. For example, the plate TM-1s may include a first part TM-1a that overlaps the first region LTA and has a first rigidity, and also include a second part TM-1b that overlaps the second region LSA and has a second rigidity. The first part TM-1a may be disposed below the display panel DP that overlaps the alignment mark AK.

According to some exemplary embodiments, the second rigidity of the second part TM-1b may be greater than the first rigidity of the first part TM-1a. In some exemplary embodiments, as shown in FIG. 7, the second part TM-1b may support almost the entirety of the display panel DP. The first part TM-1a may be a region for recognition of the alignment mark AK, and may have a planar area less than that of the second part TM-1b.

Various methods may be provided to form the plate TM-1s that includes the first and second parts TM-1a and TM-1b having different rigidities from each other. For example, the rigidities of the first and second parts TM-1a and TM-1b may be adjusted by controlling an irradiation amount or time duration of ultraviolet light that is irradiated to the first and second parts TM-1a and TM-1b of the plate TM-1s. The first and second parts TM-1a and TM-1b of the plate TM-1s may have transparency, but the second part TM-1b of the plate TM-1s may have opaqueness depending on the rigidity thereof. In contrast, the first part TM-1a of the plate TM-1s may have rigidity whose range falls within a range in which the alignment mark AK is visible.

Figure 9:
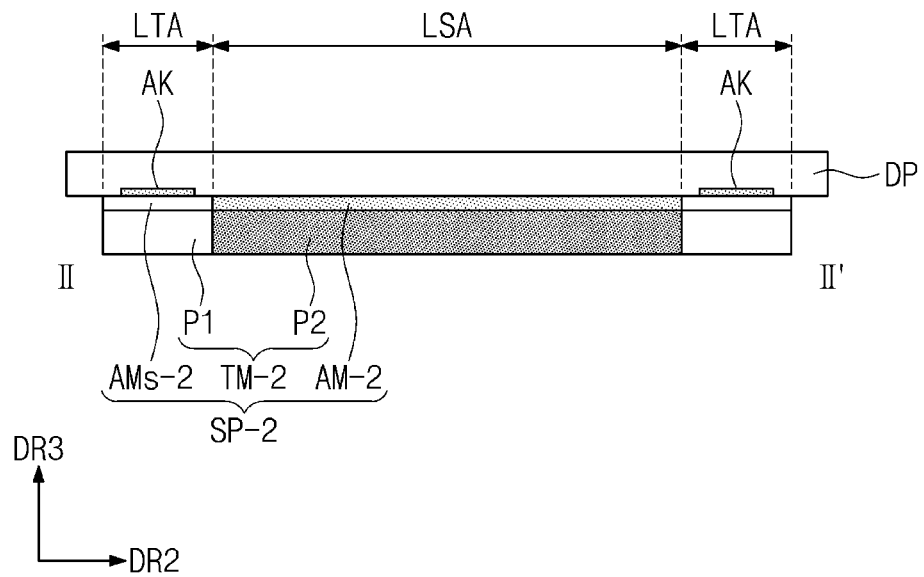
FIG. 9 is a partial, cross-sectional view of yet another exemplary embodiment of the display device of FIG. 1A.
Figure 10:
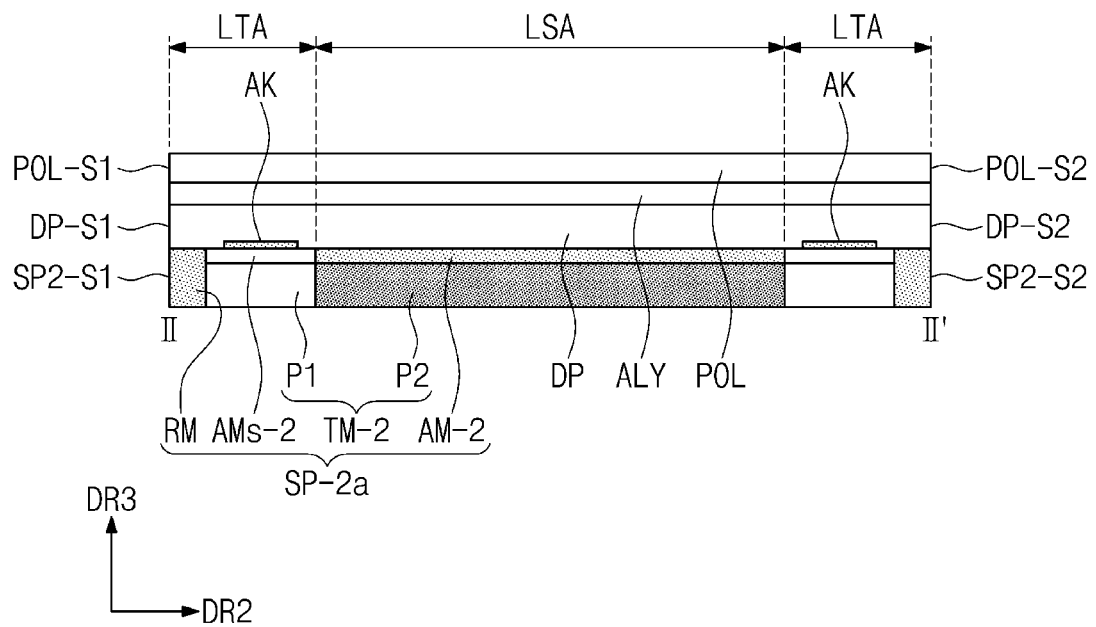
FIG. 10 is a cross-sectional view of yet a further exemplary embodiment of the display device of FIG. 1A.

FIG. 9 is a partial, cross-sectional view of yet another exemplary embodiment of the display device of FIG. 1A. FIG. 10 is a cross-sectional view of yet a further exemplary embodiment of the display device of FIG. 1A.

A support layer SP-2 shown in FIG. 9 may have substantially the same structure as that of the support layer SP-1 shown in FIG. 8A, except that a plate TM-2 is differently configured. The following will thus describe in detail a configuration of the plate TM-2 with reference to FIG. 9.

Referring to FIG. 9, the plate TM-2 includes a first part P1 and a second part P2 including different kinds of materials from each other. The first part P1 may be disposed below the display panel DP that overlaps the alignment mark AK. The first part P1 may include a transparent material such as a polyethylene terephthalate (PET), and the second part P2 may include a metallic material.

As discussed above with reference to FIG. 8B, the second part P2 of the plate TM-2 may support almost the entirety of the display panel DP. For example, as the display panel DP is supported by the second part P2 whose rigidity is greater than that of the first part P1, the display panel DP may be effectively protected from external impact or a coupling process of the lower constituent layers.

FIG. 9 shows that the first part P1 and the second part P2 are in contact with each other, but depending on process procedures, the first part P1 and the second part P2 may be spaced apart from each other at a certain interval.

An adhesive layer AM-2 may be disposed between the second part P2 and the display panel DP that overlap the second region LSA. Likewise, similar to various embodiments discussed above, the adhesive layer AM-2 may have a color, but the exemplary embodiments are not limited thereto. For example, the adhesive layer AM-2 may include a transparent material identical to that of a subsidiary adhesive layer AMs-2. As the second part P2 including a metallic material shields or reflects external light, the adhesive layer AM-2 may be provided as a transparent material.

FIG. 10 shows a structure in which the polarizing layer POL shown in FIG. 2 is coupled to the display panel DP through a module adhesive layer ALY. The module adhesive layer ALY may be an optically clear adhesive (OCA) film, an optically clear resin (OCR), or a pressure sensitive adhesive (PSA) film.

In comparison with the exemplary embodiment shown in FIG. 9, a support layer SP-2a may further include a resin RM. The resin RM may overlap the first region LTA, and may support a lateral surface of the plate TM-2 and the display panel DP that does not overlap the subsidiary adhesive layer AMs-2.

As shown in FIG. 10, the display panel DP overlapping the first region LTA includes a portion that is not supported by the first part P1 of the plate TM-2. The resin RM may support the non-supported portion of the display panel DP, and thus the display device DD may increase in reliability.

According to some exemplary embodiments, the resin RM may cause alignment between lateral surfaces of the support layer SP-2a, the display panel DP, and the polarizing layer POL. The polarizing layer POL has a first lateral surface POL-S1 and a second lateral surface POL-S2 that face each other in the second direction DR2. The display panel DP has a first lateral surface DP-S1 and a second lateral surface DP-S2 that face each other in the second direction DR2. The support layer SP-2a has a first lateral surface SP2-S1 and a second lateral surface SP2-S2 that face each other in the second direction DR2.

The first lateral surface POL-S1 of the polarizing layer POL, the first lateral surface DP-S1 of the display panel DP, and the first lateral surface SP2-S1 of the support layer SP-2*a* may be aligned with each other in the third direction DR3. The second lateral surface POL-S2 of the polarizing layer POL, the second lateral surface DP-S2 of the display panel DP, and the second lateral surface SP2-S2 of the support layer SP-2*a* may be aligned with each other in the third direction DR3. The support layer SP-2*a*, the display panel DP, and the polarizing layer POL may have their lateral surfaces that face each other in the first direction DR1 and are aligned with each other in the third direction DR3. According to some exemplary embodiments, the resin RM may have a structure to support a portion of the display panel DP, which portion is not supported by the first part P1 of the plate TM-2, and a shape of the resin RM may be variously changed.

Figure 11A:
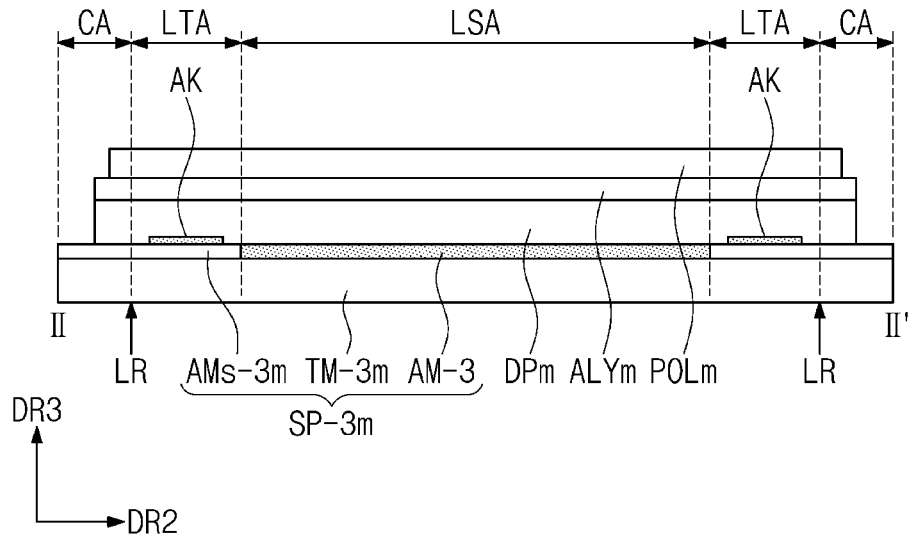
FIGS. 11A and 11B are cross-sectional views of still further exemplary embodiments of the display device of FIG. 1A.
Figure 11B:
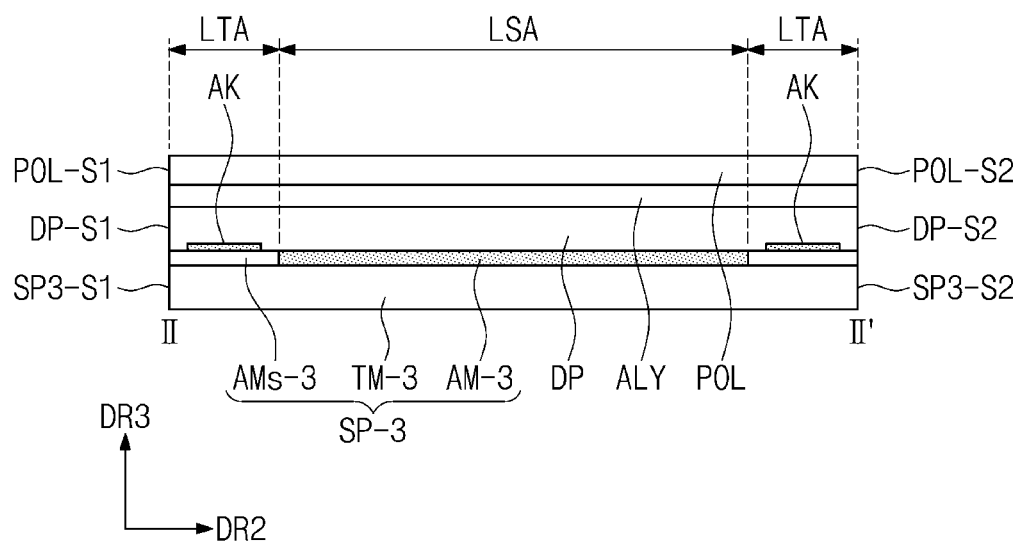

FIGS. 11A and 11B are cross-sectional views of still further exemplary embodiments of the display device of FIG. 1A.

FIG. 11A shows a state where alignment is absent between lateral surfaces of a polarizing layer POLm, a display panel DPm, a module adhesive layer ALYm, and a support layer SP-3*m*, and FIG. 11B shows a state where alignment is present between lateral surfaces of a polarizing layer POL, a display panel DP, a module adhesive layer ALY, and a support layer SP-3.

Referring to FIG. 11A, there are illustrations of the polarizing layer POLm, the display panel DPm, the module adhesive layer ALYm, and the support layer SP-3*m* that are not shaped. The pre-shaped polarizing layer POLm, the pre-shaped display panel DPm, the pre-shaped module adhesive layer ALYm, and the pre-shaped support layer SP-3*m* may have their lateral surfaces that are not aligned with each other in the third direction DR3.

According to some exemplary embodiments, the polarizing layer POLm, the display panel DPm, and the support layer SP-3*m* may be partially removed at the same time to align their lateral surfaces with each other. The explanation of the module adhesive layer ALYm is omitted for convenience of description. As shown in FIG. 11A, each of the polarizing layer POLm, the display panel DPm, and the support layer SP-3*m* includes a cut-out region CA which will be at least partially removed.

For example, a laser LR may be used such that each of the polarizing layer POLm, the display panel DPm, and the support layer SP-3*m* is removed at its cut-out region CA. As a result, as shown in FIG. 11B, the polarizing layer POL, the display panel DP, and the support layer SP-3 that have been shaped may have their lateral surfaces aligned with each other in the third direction DR3. For example, a first lateral surface POL-S1 of the polarizing layer POL, a first lateral surface DP-S1 of the display panel DP, and a first lateral surface SP3-S1 of the support layer SP-3 may be aligned with each other in the third direction DR3. A second lateral surface POL-S2 of the polarizing layer POL, a second lateral surface DP-S2 of the display panel DP, and a second lateral surface SP3-S2 of the support layer SP-3 may be aligned with each other in the third direction DR3.

A plate TM-3 of the support layer SP-3 may be formed integrally together, i.e., have a unitary single-layered shape. For example, the plate TM-3 may have its lateral surfaces that correspond to the lateral surfaces SP3-S1 and SP3-S2 of the support layer SP-3, and the lateral surfaces of the plate TM-3 may be aligned with the display panel DP and the polarizing layer POL. Accordingly, differently from that shown in FIG. 10, the support layer SP-3 shown in FIG. 11B may not include a separate resin that supports the display panel DP. An adhesive layer AM-3 may have substantially the same structure as that of the adhesive layer AM-2 shown in FIG. 9 or 10, and likewise a subsidiary adhesive layer AMs-3 may have substantially the same structures as that of the subsidiary adhesive layer AMs-2 shown in FIG. 9 or 10.

Figure 12:
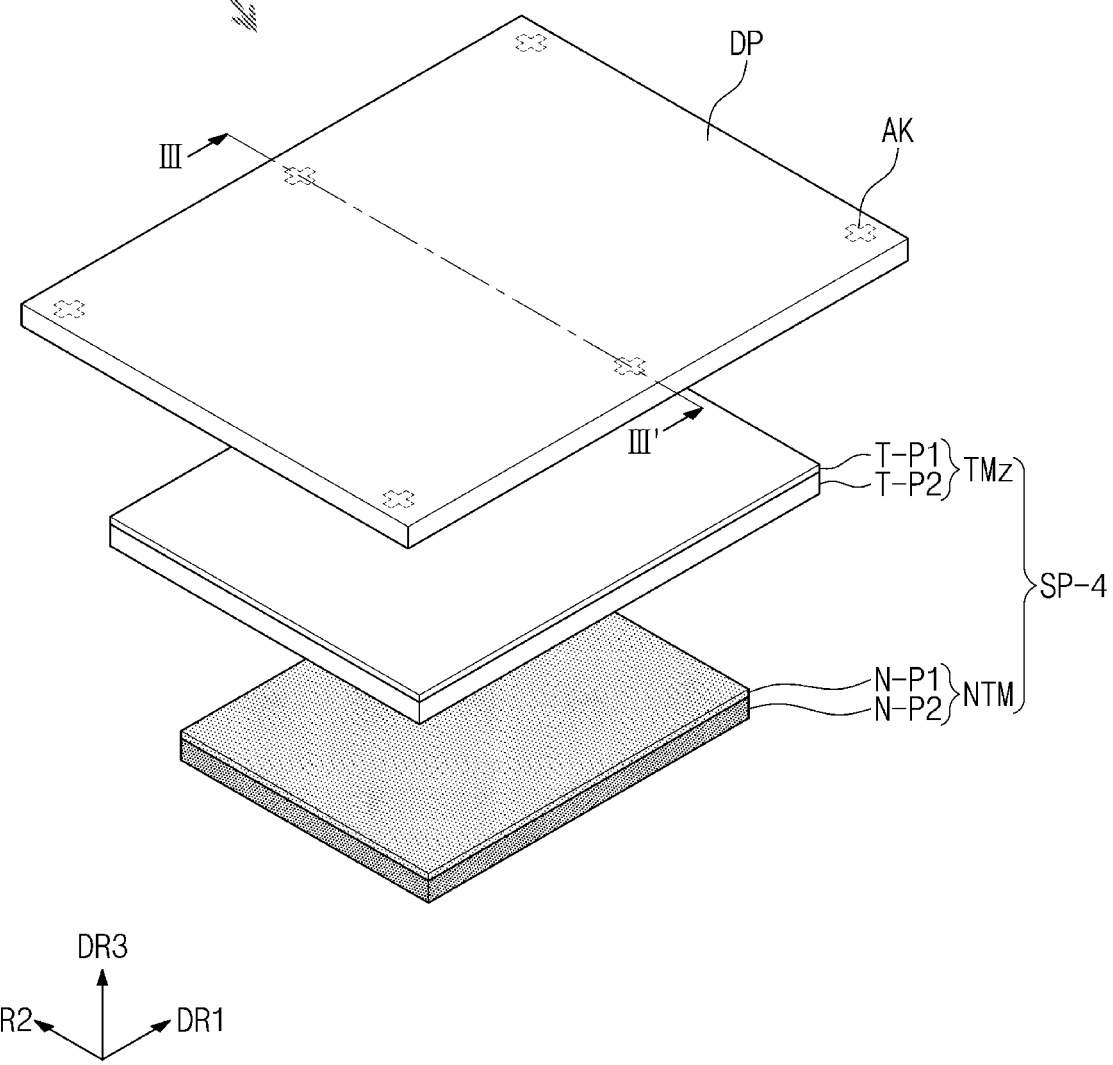
FIG. 12 is a perspective view illustrating yet a further support layer constructed according to principles of the invention.
Figure 13:
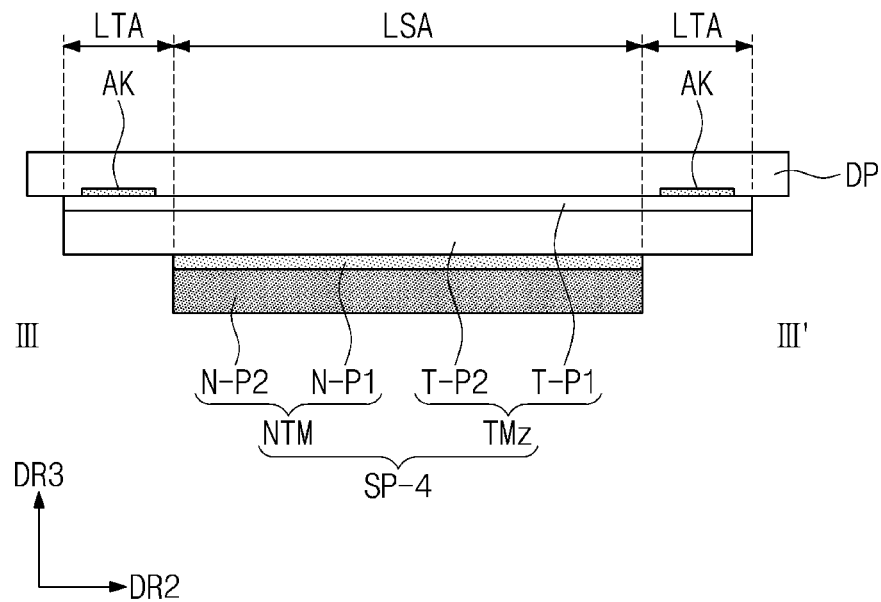
FIG. 13 is a cross-sectional view taken along line III-III' of FIG. 12 of still another exemplary embodiment illustrating the display device constructed according to principles of the invention.
Figure 14:
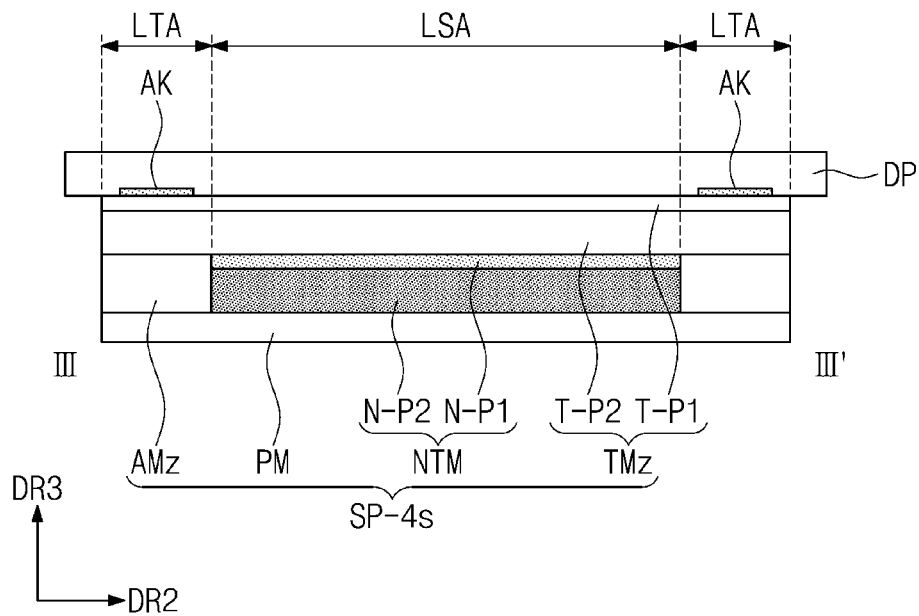
FIG. 14 is a cross-sectional view taken along line of FIG. 12 of yet still another exemplary embodiment showing the display device constructed according to principle of the invention.

FIG. 12 is a perspective view illustrating yet a further support layer constructed according to principles of the invention. FIG. 13 is a cross-sectional view taken along line III-III' of FIG. 12 of still another exemplary embodiment illustrating the display device constructed according to principles of the invention. FIG. 14 is a cross-sectional view taken along line III-III' of FIG. 12 of yet still another exemplary embodiment showing the display device constructed according to principles of the invention.

Referring to FIG. 12, a support layer SP-4 includes a first support layer TMz and a second support layer NTM. The first support layer TMz includes a first adhesive layer T-P1 and a first plate T-P2. The second support layer NTM includes a second adhesive layer N-P1 and a second plate N-P2. The first support layer TMz may be disposed between the display panel DP and the second support layer NTM. As used herein, the second support layer NTM may be called a sub-support layer, and the second plate N-P2 may be called a sub-plate.

Referring to FIG. 13, the first support layer TMz may have a planar area greater than that of the second support layer NTM. The first support layer TMz may support almost the entirety of the display panel DP that overlaps the first region LTA and the second region LSA, and the second support layer NTM may support the first support layer TMz that overlaps the second region LSA.

According to some exemplary embodiments, each of the first adhesive layer T-P1 and the first plate T-P2 may overlap the first region LTA and the second region LSA. For example, each of the first adhesive layer T-P1 and the first plate T-P2 may include a transparent material. In some exemplary embodiments, the first adhesive layer T-P1 and the first plate T-P2 may constitute a structure the same as that of the support layer SP-1 shown in FIG. 8A. The first adhesive layer T-P1 is illustrated to include a transparent adhesive material with reference to FIG. 13, but as discussed in FIG. 8A, the first adhesive layer T-P1 may have a colored adhesive material at its portion that corresponds to the second region LSA.

The second adhesive layer N-P1 of the second support layer NTM may overlap the second region LSA and may be disposed between the first plate T-P2 and the second plate N-P2. The second adhesive layer N-P1 may have a color and may absorb external light. For example, the second adhesive layer N-P1 may have a black color. The second plate N-P2 may include a metallic material and may be attached to a bottom surface of the second adhesive layer N-P1.

According to some exemplary embodiments, the second support layer NTM may be disposed below and overlaps the first support layer TMz, thereby supporting the display panel DP. For example, the second plate N-P2 may have rigidity greater than that of the first plate T-P2. As a result, the second support layer NTM may strongly support the display panel DP that corresponds to the second region LSA or the display region (see DP-DA of FIG. 3).

In comparison with the exemplary embodiment shown in FIG. 13, a support layer SP-4*s* in FIG. 14 further includes a protective layer PM and a third adhesive layer AMz. The protective layer PM may be disposed below the second support layer NTM. The protective layer PM may include a transparent material, and may prevent foreign substances from transferring to the display panel DP and the support layer SP-4s.

The third adhesive layer AMz may overlap the first region LTA, and may be disposed between the first plate T-P2 and the protective layer PM. The third adhesive layer AMz may include a transparent adhesive material. For example, as a transparent material is included in each of the first adhesive layer T-P1, the first plate T-P2, the third adhesive layer AMz, and the protective layer PM that overlap the first region LTA, the alignment mark AK may be visible from a lower side of the protective layer PM. In addition, the third adhesive layer AMz may cause alignment in the third direction DR3 between lateral surfaces of the first support layer TMz, the second support layer NTM, and the protective layer PM.

According to some exemplary embodiments, a display device may include a support layer that supports a lower portion of a display panel. For example, a first part of the support layer has a structure that overlaps an alignment mark included in the display panel. As the first part of the support layer includes a transparent material, the alignment mark may be visible even when the support layer overlaps the alignment mark.

As a result, during a manufacturing process where lower constituent layers are coupled below the support layer, the first part of the support layer overlapping the alignment mark may prevent the display panel from being impacted. Moreover, when various inspection processes are performed during the coupling process, the support layer may prevent the display panel from being impacted.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
   a base substrate including a display region and a peripheral region adjacent to the display region;
   an indicium on the base substrate; and
   a support layer below the base substrate,
   wherein the support layer includes:
      a plate that includes a first part and a second part adjacent to the first part, the first part overlapping the indicium and including a transparent material, the second part overlapping the display region; and
      a first adhesive layer between the base substrate and the second part,
   wherein the first adhesive layer has a color and does not overlap the first part.

2. The display device of claim 1, wherein the first part and the second part comprises integral portions of the plate.

3. The display device of claim 1, wherein the first part is spaced apart from the base substrate.

4. The display device of claim 2, wherein the support layer further includes a subsidiary adhesive layer between the base substrate and the first part, and the subsidiary adhesive layer overlaps the indicium and includes a transparent material.

5. The display device of claim 4, wherein a rigidity of the second part is greater than a rigidity of the first part.

6. The display device of claim 4, further comprising a polarizing layer on the base substrate,
   wherein a lateral surface of the polarizing layer, a lateral surface of the base substrate, and a lateral surface of the plate are aligned with each other.

7. The display device of claim 1, wherein the support layer further comprises a resin overlapping the base substrate, the resin at least partially covering a bottom surface of the base substrate and a lateral surface of the support layer.

8. The display device of claim 7, wherein the resin has a structure aligned with a lateral surface of the base substrate.

9. The display device of claim 2, wherein the second part has substantially the same transparent material as the first part.

10. The display device of claim 1, wherein
    the first part and the second part include different materials, and
    the support layer further includes a subsidiary adhesive layer between the base substrate and the first part, the subsidiary adhesive layer including a transparent material.

11. The display device of claim 10, wherein a rigidity of the second part is greater than a rigidity of the first part.

12. The display device of claim 11, wherein the second part includes a metallic material.

13. The display device of claim 10, wherein the support layer further includes a resin that overlaps the base substrate, the resin at least partially covering a bottom surface of the base substrate and a lateral surface of the support layer,
    wherein the resin has a structure aligned with a lateral surface of the base substrate.

14. The display device of claim 1, further comprising a sub-support layer below the support layer, wherein the sub-support layer includes: a sub-plate that overlaps the second part; and a second adhesive layer between the sub-plate and the second part.

15. The display device of claim 14, wherein the second adhesive layer has a color, and the sub-plate includes a metallic material.

16. The display device of claim 14, wherein the first adhesive layer is further disposed between the base substrate and the first part, the first adhesive layer being transparent.

17. The display device of claim 16, further comprising:
    a protective layer below the sub-support layer, the protective layer overlapping the first part and the second part; and
    a third adhesive layer between the first part and the protective layer,
    wherein each of the protective layer and the third adhesive layer is transparent.

18. The display device of claim 1, wherein the indicium comprises one or more alignment marks overlapping the peripheral region.

19. A display device comprising:
    a display panel that includes at least one alignment mark; and
    a support layer disposed below and supporting the display panel,
    wherein the support layer includes:
       a plate having a first part and a second part adjacent to the first part, the first part overlapping the alignment mark and including a transparent material; and
       an adhesive layer between the display panel and the second part, the adhesive layer not overlapping the first part, wherein an interval space is defined between the alignment mark and the first part.

\* \* \* \* \*